United States Patent [19]
Tanno et al.

[11] Patent Number: 5,198,297
[45] Date of Patent: Mar. 30, 1993

[54] MAGNETOSTATIC-WAVE CHIP AND DEVICE COMPRISING A RARE EARTH IRON-BASED OXIDE GARNET

[75] Inventors: Masayuki Tanno; Toshihiko Ryuo, both of Gunma, Japan

[73] Assignee: Shin-Etsu Chemical Co., Ltd., Tokyo, Japan

[21] Appl. No.: 781,100

[22] Filed: Oct. 22, 1991

[30] Foreign Application Priority Data

Oct. 25, 1990 [JP] Japan ............................ 2-287794

[51] Int. Cl.$^5$ .................. B32B 9/00; H01P 7/00; H01P 1/18; H01P 1/20
[52] U.S. Cl. ............................. 428/336; 428/693; 333/219.2; 333/202; 333/156; 333/148
[58] Field of Search ............... 428/693, 336; 333/219.2, 202, 156, 148

[56] References Cited

U.S. PATENT DOCUMENTS

| | | | |
|---|---|---|---|
| 4,547,754 | 10/1985 | Murakami et al. | 333/219 |
| 4,614,923 | 9/1986 | Roveda et al. | 333/147 |
| 4,745,380 | 5/1988 | Murakami et al. | 333/234 |
| 4,968,954 | 11/1990 | Ryuo et al. | 331/107 A |
| 4,992,760 | 2/1991 | Takeda et al. | 333/246 |

FOREIGN PATENT DOCUMENTS 02065308 3/1990 Japan.

OTHER PUBLICATIONS

Daniel, M. R. et al. "A Linearly Dispersive Magnetostatic Delay Line at K-Band" IEEE Trans. on Magnetics, vol. MAG-15, No. 6, Nov. 1979.

Primary Examiner—Paul J. Thibodeau
Assistant Examiner—Stevan A. Resan
Attorney, Agent, or Firm—McAulay Fisher Nissen Goldberg & Kiel

[57] ABSTRACT

A proposal is made for a magnetostatic-wave chip capable of treating a relatively large electric power even when the size of the magnetostatic-wave device, such as filters, delay lines, resonators and oscillators, constructed therewith is very small. The chip is prepared by the epitaxial growth of a rare earth-iron garnet film on the substrate surface and the desired performance of the device can be achieved when the parameters of $\Delta H/4\pi Ms, \Delta H$ being the half-value width of the magnetic rosonance peak at 9.2 GHz and $4\pi Ms$ being the saturation magnetization, and the volume of the magnetostatic-wave film of the chip fall within the area defined by the five points P1 to P5 shown in FIG. 1.

8 Claims, 4 Drawing Sheets

MAGNETOSTATIC-WAVE CHIP AND DEVICE COMPRISING A RARE EARTH IRON-BASED OXIDE GARNET

BACKGROUND OF THE INVENTION

The present invention relates to a magnetostatic-wave chip and a device therewith. More particularly, the invention relates to a magnetostatic-wave chip used as an element in various devices such as filters, delay lines, resonators, oscillators and the like working in the frequency range of 0.8 to several tens of GHz or so-called semi-microwave to microwave range.

It is known in the prior art that several rare earth-iron-based garnets such as those having a chemical composition of the formulas $Y_3Fe_5O_{12}$, $(Bi, Y, Fe)_8O_{12}$ and the like are used as the magnetostatic-wave material of the chip element in various devices such as filters, delay lines, resonators, oscillators and the like working in the frequency range of 0.8 to several tens of GHz or so-called semi-microwave to microwave range.

These known magnetostatic-wave materials, however, have a limitation in the electric power treatable therein because the high-frequency magnetization of the material inherently levels off as the high-frequency magnetic field added thereto exceeds a certain value. In a magnetostatic-wave filter used in the communication between mobile bodies constructed with such a magnetostatic-wave chip, for example, the chip size is sometimes too large for an input power of 0 dBm or larger when the increment in the insertion loss at a frequency of 0.8 GHz or higher is 3 dB as the input power is increased.

SUMMARY OF THE INVENTION

The present invention accordingly has an object to provide a magnetostatic-wave chip capable of overcoming the above mentioned limitation in the conventional magnetostatic-wave chips.

Thus, the magnetostatic-wave chip of the invention comprises a substrate and, as the magnetostatic-wave material, a film of a rare earth-iron-based oxide garnet having a thickness of 10 to 200 $\mu m$ formed on the surface of the substrate and having a volume and a ratio of the half-value width of magnetic resonance peak $\Delta H$ at a frequency of 9.2 GHz to the saturation magnetization $4\pi$ Ms, i.e. $\Delta H/4\pi$ Ms, satisfying the relationship to fall within the pentagonal area surrounded by the lines connecting the five points P1, P2, P3, P4 and P5 as shown in FIG. 1 of the accompanying drawing, each of P1 to P5 having coordinates of P1 ($0.5 \times 10^{-3}$, 3.0 mm$^3$), P2 ($11.0 \times 10^{-3}$, 3.0 mm$^3$), P3 ($11.0 \times 10^{-3}$, 0.01 mm$^3$), P4 ($3.0 \times 10^{-3}$, 0.01 mm$^3$) or P5 ($0.5 \times 10^{-3}$, 0.25 mm$^3$), taking $\Delta H/4\pi$ Ms as the abscissa and the volume as the ordinate.

BRIEF DESCRIPTION OF THE DRAWING

FIG. 2a is a schematic illustration of a plan view of a magnetostatic-wave filter using the inventive magnetostatic-wave chip and FIG. 2b is a cross sectional view of the same as cut and viewed along the direction indicated by the arrows IIb—IIb in FIG. 2a.

DETAILED DESCRIPTION OF THE PREFERRED EMBODIMENTS

As is described above, the inventive magnetostatic-wave chip comprises a substrate and, as the magnetostatic-wave material, a film of a magnetic rare earth-iron-based oxide garnet formed on the surface of the substrate which is a single crystal of a rare earth-gallium garnet. Such a magnetic oxide film can be formed on the substrate surface by the so-called liquid-phase epitaxial method.

The substrate single crystal of the rare earth-gallium garnet can be prepared by the so-called Czochralski method in which rare earth oxides such as gadolinium oxide $Gd_2O_3$, samarium oxide $Sm_2O_3$, neodymium oxide $Nd_2O_3$ and the like and gallium oxide $Ga_2O_3$ together with or without addition of a modifying agent such as calcium oxide CaO, magnesium oxide MgO, zirconium oxide $ZrO_2$, yttrium oxide $Y_2O_3$ and the like are introduced into an iridium crucible in which the oxides are melted together by high-frequency induction heating followed by contacting of a seed crystal with the melt and pulling up the seed. Typical rare earth-gallium garnets suitable for use as the substrate include gadolinium gallium garnet, referred to as GGG hereinbelow, samarium gallium garnet and neodymium gallium garnet as well as GGGs modified by one or a combination of the oxides of calcium, magnesium, zirconium and yttrium as commercially available under the tradenames of SOG, NOG and YOG manufactured and sold by Shin-Etsu Chemical Co., Japan.

The liquid-phase epitaxial method is preformed by immersing and keeping a wafer of the above mentioned substrate garnet single crystal in a melt of an oxide mixture including yttrium oxide $Y_2O_3$, iron oxide $Fe_2O_3$ and, if necessary, bismuth oxide $Bi_2O_3$, lanthanum oxide $La_2O_3$, gadolinium oxide $Gd_2O_3$ and/or gallium oxide $Ga_2O_3$ together with flux materials such as lead oxide and boron oxide formed in a platinum crucible by heating at 1100° to 1200° C. while the melt is kept in a supercooled condition so as to deposit the epitaxial film of the rare earth-based garnet on the substrate surface. The magnetic garnet film typically has a chemical composition of the formula such as $(BiY)_3Fe_5O_{12}$, $(LaY)_3Fe_5O_{12}$, $(LaY)_3(FeGa)_5O_{12}$, $(GdY)_3Fe_5O_{12}$, $(GdY)_3Fe_5O_{12}$, $(BiY)_3(FeGa)_5O_{12}$ and the like. The thus formed magnetic garnet film on the substrate surface should have a thickness in the range from 10 to 200 $\mu m$.

Figure 1:
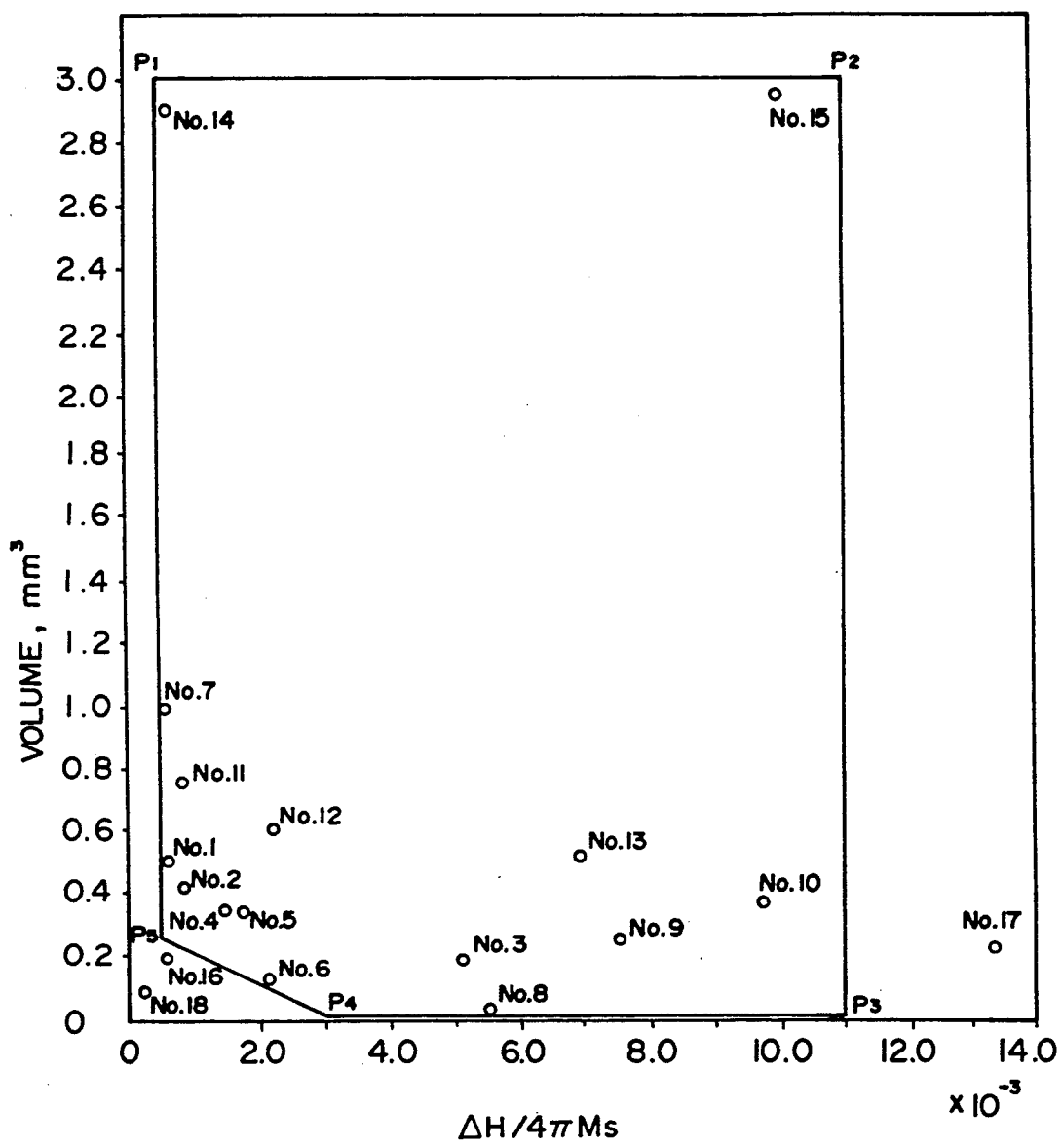
FIG. 1 is a $\Delta H/4\pi$ Ms vs. volume diagram showing the range of the claimed relationship between $\Delta H/4\pi$ Ms and the volume of the magnetostatic-wave film defined by the five points P1 to P5 as well as the values of $\Delta H/4\pi$ Ms and the volume of the 18 samples prepared in the Examples by the points No. 1 to No. 18.

The thus prepared magnetic garnet films on the substrate surface were subjected to the measurements of the volume, saturation magnetization $4\pi$ Ms and half-value width of the magnetic resonance peak $\Delta H$ at a frequency of 9.2 GHz along with measurements of the performance characteristics of magnetostatic-wave devices prepared by using the same. These measurements have led to an unexpected discovery that a small-sized magnetostatic-wave device is capable of treating a relatively large electric power only when the magnetic garnet film on the substrate surface has a volume and a ratio of the half-value width of magnetic resonance peak $\Delta H$ to saturation magnetization $4\pi$ Ms, i.e. $\Delta H/4\pi$ Ms, satisfying the relationship to fall within the pentagonal area surrounded by the line segments connecting two of the five points P1, P2, P3, P4 and P5 as shown in FIG. 1 of the accompanying drawing, each point having coordinates of P1 ($0.5 \times 10^{-3}$, 3.0 mm$^3$), P2 ($11.0 \times 10^{-3}$, 3.0 mm$^3$), P3 ($11.0 \times 10^{-3}$, 0.01 mm$^3$), P4 ($3.0 \times 10^{-3}$, 0.01 mm$^3$) or P5 ($0.5 \times 10^{-3}$, 0.25 mm$^3$), taking $\Delta H/4\pi$ Ms as the abscissa and the volume as the ordinate. Further, the temperature dependence of the device can be improved when the saturation magnetization of the magnetic garnet film is 1000 gauss or smaller. When the volume and the ratio $\Delta H/4\pi$ Ms of the magnetic garnet film fall outside of the pentagonal area in FIG. 1 defined by the five points P1 to P5, the magnetostatic-wave device would be unsatisfactory in the performance. When the point giving the volume and the ratio $\Delta H/4\pi$ Ms falls within the zone outside the lower left end of the pentagonal area, as the points No. 16 and No. 18, in FIG. 1, for example, large electric powers cannot be treated with the device. When the point giving the volume and the ratio $\Delta H/4\pi$ Ms falls within the zone outside of the right end of the pentagonal area, as the point No. 17, on the other hand, the loss would exceed 6 dB although the device is suitable for treating a large electric power. Needless to say, no small-sized device can be prepared when the point giving the volume and the ratio $\Delta H/4\pi$ Ms of the magnetic garnet film falls within the zone outside of the upper end of the pentagonal area in FIG. 1.

Figure 2A:
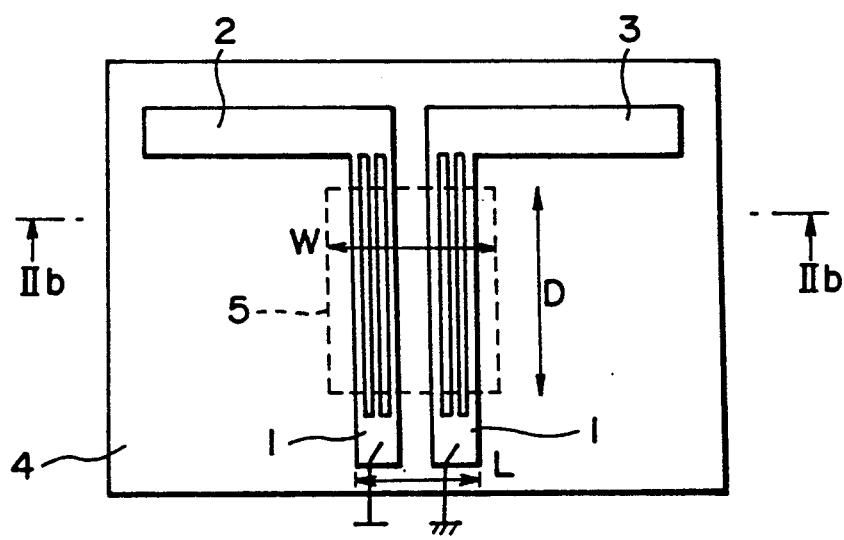
Figure 2B:
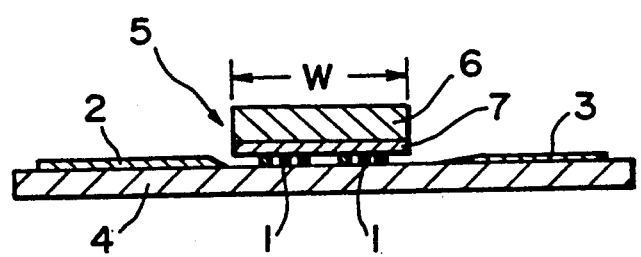

FIGS. 2a and 2b illustrate a magnetostatic-wave filter using the magnetostatic-wave chip of the invention, of which FIG. 2a is a plan view of the filter and FIG. 2b is a cross sectional view of the same as cut and viewed along the direction shown by the arrows IIb—IIb in FIG. 2a. As is illustrated in FIG. 2b, a pair of parallel-strip transducers 1 and an input electrode 2 and an output electrode 3 of, for example, a gold foil connected each to one of the parallel-strip transducers 1 are provided at the center of the surface of a base plate 4 of, for example, an alumina ceramic and at least one magnetostatic-wave chip 5 is mounted thereon. The magnetostatic-wave chip 5 is formed from a substrate 6 and a magnetostatic garnet film 7 having a volume and a ratio $\Delta H/4\pi$ Ms satisfying the relationship defined above. The distance L between the paired parallel-strip transducers 1 is 0.5 to 1.5 mm in order to minimize the propagation loss of the magnetostatic waves. The width W of the magnetostatic-wave chip 5 in the direction connecting the electrodes 2, 3 is preferably at least equal to but not exceeding twice of the distance L in order to minimize the insertion loss. The parallel-strip transducers preferably have a radiation resistance of 50 ohm in order to minimize the loss by the mismatching of the impedance. Correspondingly, the length D of the magnetostatic-wave chip 5 in the direction of the parallel-strip transducers 1 is selected such that the resistance between the input electrode 2 or output electrode 3 and the ground is in the range from 10 to 200 ohm to be not far from the above mentioned radiation resistance In the magnetostatic-wave filter described above, the input power or the saturation input power as is referred to hereinbelow at a frequency of 0.8 GHz or higher is at least 0 dBm when the increment in the insertion loss of the filter is 3 dB by increasing the input power at a frequency of 0.8 GHz or higher.

It is sometimes preferable to use two magnetostatic-wave chips each having a one-half length of D as mounted in parallel to replace the chip 5 in FIG. 2a in respect of easy separation of the higher-order mode as a spurious magnetic resonance. In other words, the chip 5 in FIG. 2a is divided into equal halves along the direction of the width W. Similarly, the chip 5 can be divided into three or four equal portions along the direction of the width W to have a length of one third or one fourth, respectively, of D.

Preferably, the magnetostatic-wave device according to the invention comprises: a substrate plate; a parallel-strip input transducer mounted on the substrate; a parallel-strip output transducer mounted on the substrate; and a magnetostatic-wave chip according to claim 1 in a square or rectangular form, one of the sides thereof being contacted with the parallel-strip transducer in parallel thereto and the length of the side of the chip perpendicular to the parallel-strip transducers being at least equal to but not exceeding twice of the distance between the parallel-strip input transducer and the parallel-strip output transducer.

In the following, examples are given to illustrate the inventive magnetostatic-wave chips in more detail. In the examples below, the half-value width of magnetic resonance peak $\Delta H$ was obtained by the measurement using a ferrimagnetic resonance apparatus at a frequency of 9.2 GHz, the saturation magnetization was determined by the vibrating-sensor method and the output characteristic of the magnetostatic-wave filter was obtained using a network analyzer.

EXAMPLES 1 TO 15 AND COMPARATIVE EXAMPLES 1 TO 3.

As a substrate for the liquid-phase epitaxial growth of a rare earth-iron-based magnetic garnet film, wafers of two types of rare earth-gallium garnet single crystals were prepared including those of GGG having a lattice constant of 1.2383 nm and those of a GGG modified with yttrium (YOG, a tradename) having a lattice constant of 1.237 nm. The wafers each had a thickness of 500 μm and diameter of 3 inches.

Three or four kinds of the oxides selected from the oxides of yttrium, iron, bismuth, lanthanum, gadolinium and gallium according to the desired chemical composition of the epitaxial magnetic garnet film as indicated below as Samples No. 1 to No. 15 corresponding to Examples 1 to 15, respectively, and Samples No. 16 to No. 18 corresponding to Comparative Examples 1 to 3, respectively, were taken in a platinum crucible each in a calculated amount together with lead oxide and boron oxide as the flux material and they were melted together by heating at 1100° C. to form a melt in which one of the substrate wafers was immersed and kept under supercooling of the melt so as to grow an epitaxial film on the substrate surface. The thickness of each of the thus formed epitaxial magnetic garnet films was determined by using a spectrophotometer to give the results shown in Table 1.

| Sample No. 1: | $Bi_{0.01}Y_{2.99}Fe_{5.00}O_{12}$ |
|---|---|
| Sample No. 2: | $Bi_{0.01}Y_{2.99}Fe_{5.00}O_{12}$ |
| Sample No. 3: | $La_{0.01}Y_{2.99}Fe_{4.04}Ga_{0.96}O_{12}$ |
| Sample No. 4: | $Gd_{0.02}Y_{2.98}Fe_{5.00}O_{12}$ |
| Sample No. 5: | $Bi_{0.01}Y_{2.99}Fe_{4.45}Ga_{0.55}O_{12}$ |
| Sample No. 6: | $Bi_{0.01}Y_{2.99}Fe_{4.41}Ga_{0.59}O_{12}$ |
| Sample No. 7: | $Bi_{0.01}Y_{2.99}Fe_{5.00}O_{12}$ |
| Sample No. 8: | $La_{0.01}Y_{2.99}Fe_{4.08}Ga_{0.92}O_{12}$ |
| Sample No. 9: | $Bi_{0.01}Y_{2.99}Fe_{4.10}Ga_{0.90}O_{12}$ |
| Sample No. 10: | $Bi_{0.01}Y_{2.99}Fe_{3.98}Ga_{1.02}O_{12}$ |
| Sample No. 11: | $Bi_{0.01}Y_{2.99}Fe_{5.00}O_{12}$ |
| Sample No. 12: | $Bi_{0.01}Y_{2.99}Fe_{4.50}Ga_{0.50}O_{12}$ |

-continued

| | |
|---|---|
| Sample No. 13: | $La_{0.01}Y_{2.99}Fe_{4.04}Ga_{0.96}O_{12}$ |
| Sample No. 14: | $Bi_{0.01}Y_{2.99}Fe_{5.00}O_{12}$ |
| Sample No. 15: | $Bi_{0.01}Y_{2.99}Fe_{4.03}Ga_{0.97}O_{12}$ |
| Sample No. 16: | $Bi_{0.01}Y_{2.99}Fe_{5.00}O_{12}$ |
| Sample No. 17: | $La_{0.01}Y_{2.99}Fe_{4.04}Ga_{0.96}O_{12}$ |
| Sample No. 18: | $Bi_{0.01}Y_{2.99}Fe_{5.00}O_{12}$ |

A square piece of 1.0 mm by 1.0 mm wide was taken by cutting from each of the epitaxially grown magnetic garnet films and placed in the cylindrical cavity of a ferrimagnetic resonance apparatus working at a frequency of 9.2 GHz in such a disposition that the 1.0 mm by 1.0 mm surface of the piece was perpendicular to the directipon of the magnetic field to determine the half-value width of the magnetic resonance peak $\Delta H$. The results are shown in Table 1 which also shows the saturation magnetization $4\pi$ Ms of the magnetic film and the ratio of $\Delta H/4\pi$ Ms.

Figure 3:
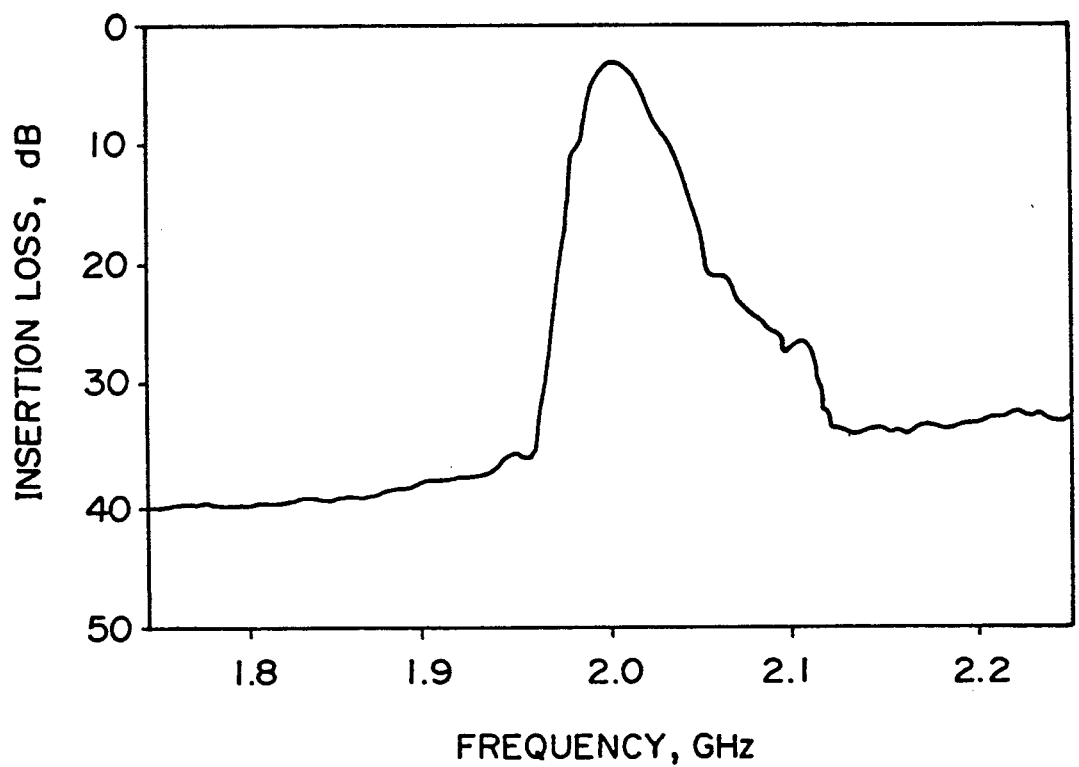
FIGS. 3 and 4 are each a graph showing the insertion loss in the magnetostatic-wave filter using the inventive magnetostatic-wave chip as a function of the frequency and input power, respectively.
Figure 4:
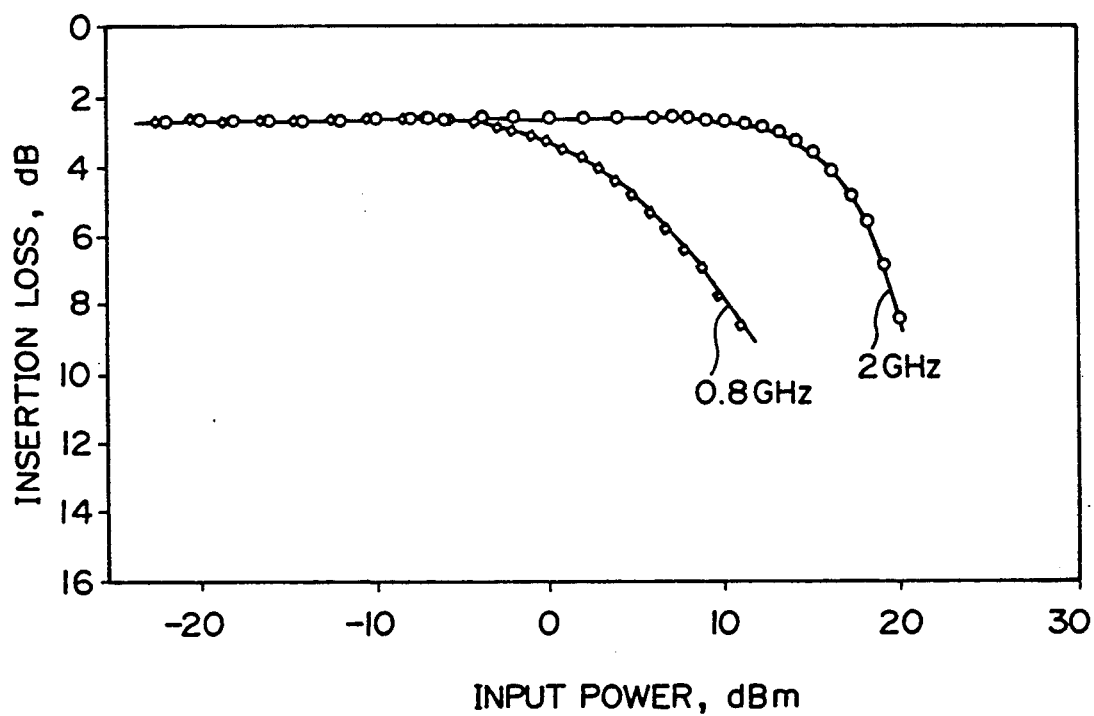

Separately, a 1.2 mm by 3.2 mm wide rectangular chip, of which the epitaxially grown magnetic film had a volume of 0.189 mm$^3$, was prepared by cutting the epitaxial wafer of Sample No. 3 and used in preparing a magnetostatic-wave filter as illustrated in FIGS. 2a and 2b. The parallel-strip transducers for transmission and receiving made from a gold foil each had three line electrodes of 50 $\mu$m width and the distance therebetween was 0.6 mm as mounted on a base plate of alumina ceramic. The chip was mounted and adhesively bonded to the transducers in such a symmetrical disposition to bridge the transducers that the longer side of the chip was in parallel with the line electrodes of the transducers. The magnetostatic-wave filter was put into a small electromagnet to determine the insertion loss as a function of the frequency when a magnetic field of 3000 Oe at the highest was applied to the magnetic film in the direction perpendicular to the surface. The results are shown graphically in FIG. 3 indicating a minimum of the insertion loss at a frequency of 2.0 GHz. Further, the dependence of the insertion loss on the input power was examined at a frequency of 2.0 GHz by varying the input power in the range from −20 dBm to +20 dBm. Similar measurements were conducted at a frequency of 0.8 GHz of the pass band of the filter. The results are graphically shown in FIG. 4. As is shown in the figure, the insertion loss is constant at 2.7 dB irrespective of the frequency when the input power is relatively small but begins to decrease as the input power exceedds a certain value. The curves in FIG. 4 indicate that an increment of 3 dB in the insertion loss takes place when the saturation input power is 7.0 dBm and 18.0 dBm at the frequencies of 0.8 GHz and 2.0 GHz, respectively.

In parallel with the above described experiments, each of the epitaxial wafers of the samples No. 1 to No. 18 excepting No. 3, of which No. 16 to No. 18 were for comparative purpose, was cut to prepare a magnetostatic-wave chip, of which the magnetic garnet film had a volume indicated in Table 1, and the chips were used each for constructing a magnetostatic-wave filter in the same manner as described above. Table 1 shows the results obtained by the measurements of the insertion loss at a low input power for the two frequencies and the saturation input power to cause an increment of 3 dB from the low-input value at the two frequencies. The values of the volume in mm$^3$ and the ratio of $\Delta H/4\pi$ Ms of these magnetostatic-wave chips are plotted in FIG. 1 indicating the Sample No.

TABLE 1

(Part 1)

| | Sample No. | | | | | |
|---|---|---|---|---|---|---|
| | 1 | 2 | 3 | 4 | 5 | 6 |
| $\Delta H$, Oe | 1.08 | 1.48 | 1.90 | 2.56 | 1.50 | 1.70 |
| $4\pi$Ms, G | 1780 | 1760 | 375 | 1740 | 850 | 800 |
| $\Delta H/4\pi$Ms, $\times 10^{-3}$ | 0.61 | 0.83 | 5.07 | 1.47 | 1.76 | 2.13 |
| Film thickness, $\mu$m | 130 | 110 | 49.1 | 92.0 | 70.0 | 30.0 |
| Volume, mm$^3$ | 0.50 | 0.42 | 0.189 | 0.353 | 0.269 | 0.115 |
| Saturation input power at 0.8 GHz, dBm | 3.0 | 5.2 | 7.0 | 10.5 | 8.0 | 3.4 |
| Saturation input power at 2.0 GHz, dBm | 13.2 | 16.1 | 18.0 | 20.7 | 19.2 | 14.0 |
| Insertion loss at 0.8 GHz, dB | 2.4 | 3.1 | 2.7 | 3.1 | 3.3 | 3.8 |
| Insertion loss at 2.0 GHz, dB | 2.5 | 3.0 | 2.7 | 3.2 | 3.5 | 3.8 |

(Part 2)

| | Sample No. | | | | | |
|---|---|---|---|---|---|---|
| | 7 | 8 | 9 | 10 | 11 | 12 |
| $\Delta H$, Oe | 1.10 | 2.10 | 3.06 | 3.50 | 1.48 | 2.00 |
| $4\pi$Ms, G | 1780 | 380 | 410 | 360 | 1780 | 900 |
| $\Delta H/4\pi$Ms, $\times 10^{-3}$ | 0.62 | 5.53 | 7.46 | 9.72 | 0.83 | 2.20 |
| Film thickness, $\mu$m | 100 | 30.0 | 66.3 | 100 | 100 | 80.0 |
| Volume, mm$^3$ | 1.00 | 0.03 | 0.255 | 0.384 | 0.75 | 0.60 |
| Saturation input power at 0.8 GHz, dBm | 9.5 | 0.5 | 11.6 | 16.0 | 12.0 | 13.5 |
| Saturation input power at 2.0 GHz, dBm | 19.1 | 11.3 | 21.0 | 28.0 | 23.5 | 24.0 |
| Insertion loss at 0.8 GHz, dB | 2.3 | 3.8 | 3.6 | 4.1 | 2.7 | 3.2 |
| Insertion loss at 2.0 GHz, dB | 2.6 | 4.0 | 3.6 | 4.2 | 2.8 | 3.4 |

TABLE 1-continued (Part 3)

| | Sample No. | | | | | |
|---|---|---|---|---|---|---|
| | 13 | 14 | 15 | 16* | 17* | 18* |
| $\Delta H$, Oe | 2.60 | 1.15 | 3.70 | 1.10 | 5.00 | 0.40 |
| $4\pi Ms$, G | 375 | 1780 | 370 | 1780 | 75 | 1780 |
| $\Delta H/4\pi Ms$, $\times 10^{-3}$ | 6.90 | 0.646 | 10.0 | 0.62 | 13.30 | 0.22 |
| Film thickness, $\mu m$ | 70.0 | 150 | 115 | 50.0 | 60.0 | 20.0 |
| Volume, $mm^3$ | 0.525 | 2.90 | 2.95 | 0.192 | 0.230 | 0.077 |
| Saturation input power at 0.8 GHz, dBm | 17.2 | 30.1 | 40.1 | −5.2 | 18.1 | −13.0 |
| Saturation input power at 2.0 GHz, dBm | 26.3 | 43.1 | 52.2 | 8.0 | 29.0 | −0.2 |
| Insertion loss at 0.8 GHz, dB | 4.2 | 3.3 | 4.7 | 2.1 | 7.9 | 2.3 |
| Insertion loss at 2.0 GHz, dB | 4.5 | 3.6 | 4.9 | 2.1 | 8.5 | 2.3 |

*Comparative Examples

We claim:

1. A magnetostatic-wave chip which comprises:
   (a) a substrate; and
   (b) a film of rare earth-iron-based oxide garnet having a thickness of 10 to 200 $\mu m$ formed as the magnetostatic-wave material on the surface of the substrate and having a volume and value of $\Delta 7/4\pi Ms$, which is the ratio of the half-value width of magnetic resonance peak $\Delta H$ at a frequency of 9.2 GHz to the saturation magnetization $4\pi Ms$, satisfying a relationship so as to fall within the pentagonal area surrounded by the lines connecting the five points P1, P2, P3, P4 and P5 in the diagram of FIG. 1 of the accompanying drawing, each point having coordinates of P1 ($0.5 \times 10^{-3}$, 3.0 $mm^3$), P2 ($11.0 \times 10^{-3}$, 3.0 $mm^3$), P3 ($11.0 \times 10^{-3}$, 0.01 $mm^3$), P4 ($3.0 \times 10^{-3}$, 0.01 $mm^3$) or P5 ($0.5 \times 10^{-3}$, 0.25 $mm^3$), all taking $\Delta H/4\pi Ms$ as the abscissa and the volume as the ordinate, the chip being capable of treating a relatively large electric power of at least 0 dBm, at a frequency of 0.8 GHz or higher, when the insertion loss is 3 dB.

2. The magnetostatic-wave chip as claimed in claim 1 in which the film of a rare earth-iron-based oxide garnet is an epitaxial film grown on the surface of the substrate by the liquid-phase epitaxial method.

3. The magnetostatic-wave chip as claimed in claim 1 in which the rare earth-iron-based oxide garnet has a chemical composition expressed by the formula $Bi_xY_{3-x}Fe_5O_{12}$, in which the substrate x is a positive number in the range from 0.01 to 0.3.

4. The magnetostatic-wave chip as claimed in claim 1 in which the rare earth-iron-based oxide garnet has a chemical composition expressed by the formula $La_xY_{3-x}Fe_5O_{12}$, in which the substrate x is a positive number in the range from 0.01 to 0.3.

5. The magnetostatic-wave chip as claimed in claim 1 in which the rare earth-iron-based oxide garnet has a chemical composition expressed by the formula $Gd_xY_{3-x}Fe_5O_{12}$, in which the substrate x is a positive number in the range from 0.01 to 0.3.

6. The magnetostatic-wave chip as claimed in claim 1 in which the rare earth-iron-based oxide garnet has a chemical composition expressed by the formula $Bi_xY_{3-x}Fe_{5-y}Ga_yO_{12}$, in which the substrate x is a positive number in the range from 0.01 to 0.3 and the subscript y is a positive number in the range from 0.1 to 1.1.

7. The magnetostatic-wave chip as claimed in claim 1 in which the rare earth-iron-based oxide garnet has a chemical composition expressed by the formula $La_xY_{3-x}Fe_{5-y}Ga_yO_{12}$, in which the substrate x is a positive number in the range from 0.01 to 0.3 and the subscript y is a positive number in the range from 0.1 to 1.1.

8. A magnetostatic-wave device which comprises: a substrate plate; a parallel-strip input transducer mounted on the substrate; a parallel-strip output transducer mounted on the substrate; and a magnetostatic-wave chip according to claim 1 in a square or rectangular form, one of the sides thereof being contacted with the parallel-strip transducer in parallel thereto and the length of the side of the chip perpendicular to the parallel-strip transducers being at least equal to but not exceeding twice of the distance between the parallel-strip input transducer and the parallel-strip output transducer.

* * * * *

UNITED STATES PATENT AND TRADEMARK OFFICE
CERTIFICATE OF CORRECTION

PATENT NO. : 5,198,297
DATED : March 30, 1993
INVENTOR(S) : Masayuki TANNO, et al It is certified that error appears in the above-indentified patent and that said Letters Patent is hereby corrected as shown below:

Column 7, Claim 1, line 26, after of change " $\Delta 7/4\pi Ms$ "

to -- $\Delta H/4\pi Ms$ --

Signed and Sealed this

Fifteenth Day of November, 1994

Attest:

BRUCE LEHMAN

*Attesting Officer*     *Commissioner of Patents and Trademarks*